US008827384B2

(12) United States Patent  (10) Patent No.: US 8,827,384 B2
Chen  (45) Date of Patent: Sep. 9, 2014

(54) ELECTRONIC APPARATUS AND FIXING STRUCTURE FOR POWER MODULE THEREFOR

(71) Applicant: Wistron Corporation, New Taipei (TW)

(72) Inventor: Chun-Yu Chen, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 36 days.

(21) Appl. No.: 13/665,945

(22) Filed: Nov. 1, 2012

(65) Prior Publication Data

US 2013/0169124 A1    Jul. 4, 2013

(30) Foreign Application Priority Data

Jan. 3, 2012   (TW) .............................. 101200115 U

(51) Int. Cl.
*A47B 81/00*  (2006.01)
*A47B 97/00*  (2006.01)

(52) U.S. Cl.
USPC ...................................................... 312/223.2

(58) Field of Classification Search
USPC ................. 312/223.2, 265.5, 265.6, 111;
361/679.01, 679.02, 679.33, 724–727;
248/200, 300, 225.11; 211/26
See application file for complete search history.

(56) References Cited

U.S. PATENT DOCUMENTS

| 4,254,945 | A   | * | 3/1981  | Paulson et al. ............... 269/102 |
| 5,838,538 | A   | * | 11/1998 | Yee ............................ 361/679.6 |
| 6,208,520 | B1  | * | 3/2001  | Schmitt ........................ 361/725 |
| 6,244,953 | B1  | * | 6/2001  | Dugan et al. .................. 454/184 |
| 7,661,640 | B2  | * | 2/2010  | Persson ..................... 248/225.11 |
| 2003/0102785 | A1 | * | 6/2003  | Tsai et al. ................... 312/223.1 |
| 2003/0112596 | A1 | * | 6/2003  | Shih ............................. 361/685 |
| 2008/0247130 | A1 | * | 10/2008 | Chen ............................ 361/685 |
| 2010/0027214 | A1 | * | 2/2010  | Wu et al. .................. 361/679.47 |
| 2010/0253186 | A1 | * | 10/2010 | Chen et al. .................. 312/223.1 |
| 2010/0264787 | A1 | * | 10/2010 | Fan et al. .................... 312/223.2 |
| 2010/0309611 | A1 | * | 12/2010 | Fan et al. ................ 361/679.01 |
| 2011/0261526 | A1 | * | 10/2011 | Atkins et al. ............ 361/679.33 |

* cited by examiner

*Primary Examiner* — Darnell Jayne
*Assistant Examiner* — Andrew Roersma
(74) *Attorney, Agent, or Firm* — Winston Hsu; Scott Margo

(57) ABSTRACT

An electronic apparatus includes an apparatus casing and a fixing structure disposed in the apparatus casing. The fixing structure includes a mounting base, close to a main board inside the apparatus casing and thereon forming a sliding slot, and a detachable bracket, including a frame and a guiding part connected to the frame fixedly. The guiding part is capable of being slid into the sliding slot so as to mount the detachable bracket on the mounting base. The frame forms an accommodating space in the apparatus casing. The opening of the accommodating space is toward the opening of the apparatus casing; a removable power module is capable of being inserted into the accommodating space through the openings. Thereby, the invention can reduce the installation complexity of a conventional fixing structure for removable power module efficiently.

12 Claims, 9 Drawing Sheets

ELECTRONIC APPARATUS AND FIXING STRUCTURE FOR POWER MODULE THEREFOR

BACKGROUND OF THE INVENTION

1. Field of the Invention

The invention relates to an electronic apparatus and a fixing structure for power module therefor, and especially relates to a fixing structure installed by use of slide structure and to an electronic apparatus with the fixing structure.

2. Description of the Prior Art

Power modules for conventional large-volume electronic apparatus are usually disposed immovably in the apparatus casing by use of screws. Based on usage requirement, design for electronic apparatus with redundant power supply has been developed for avoiding risk of the whole system failing as a single power module fail. In practice, because the stationary power module and the redundant power module are different in structure, the electronic apparatus is usually equipped with a stationary power module or a redundant power module according to the specification thereof. However, when a user may want to change the power module for some reason during the service life of the electronic apparatus, the user needs to detach several screws, exchange another power module, and screw the screws. It is complicated. Further, if the internal space of the electronic apparatus is limited, a fixing structure for the power module is usually disposed close to other components (e.g. main board) leading to the fact that the fixing structure cannot be disassembled independently. It is necessary for the above exchange operation of power module to disassemble the adjacent components together with the fixing structure, which makes the above exchange operation more complicated.

SUMMARY OF THE INVENTION

An objective of the invention is to provide a fixing structure for power module. The fixing structure is installed in an apparatus casing and uses slide structure for simplification of disassembly and assembly operation and further for avoiding disassembling or moving other components during the above disassembly and assembly operation.

The fixing structure for power module of the invention is disposed in an apparatus casing. The apparatus casing has a first opening. The fixing structure includes a mounting base and a detachable bracket. The mounting base is mounted in the apparatus casing. The mounting base thereon forms a sliding slot. The detachable bracket is disposed in the apparatus casing. The detachable bracket includes a frame and a guiding part connected to the frame fixedly. The guiding part is capable of being slid into the sliding slot so as to mount the detachable bracket on the mounting base. Therein, the frame forms an accommodating space in the apparatus casing. The accommodating space has a second opening toward the first opening. A power module outside the apparatus casing is capable of being inserted into the accommodating space through the second opening in a removable way. Thereby, the detachable bracket can be fixed with fewer screws or without a screw, which simplifies exchange operation of the power module efficiently and further avoids disassembling or moving other components in the apparatus casing during disassembly and assembly operation.

An objective of the invention is to provide an electronic apparatus, which includes a fixing structure for power module of the invention. Therefore, the electronic apparatus also can simplify the disassembly and assembly operation and further avoid disassembling or moving other components inside the electronic apparatus during the disassembly and assembly operation.

The electronic apparatus of the invention includes an apparatus casing, a main board, and a fixing structure for power module. The apparatus casing has a first opening. The main board is disposed in the apparatus casing. The fixing structure for power module is disposed in the apparatus casing and includes a mounting base and a detachable bracket. The mounting base is mounted in the apparatus casing close to the main board. The mounting base thereon forms a sliding slot. The detachable bracket is disposed in the apparatus casing and includes a frame and a guiding part connected to the frame fixedly. The guiding part is capable of slid into the sliding slot so as to mount the detachable bracket on the mounting base. Therein, the frame forms an accommodating space in the apparatus casing. The accommodating space has a second opening toward the first opening. A power module outside the apparatus casing is capable of being inserted into the accommodating space through the second opening in a removable way. Similarly, the detachable bracket can be fixed with fewer screws or without a screw, which simplifies exchange operation of the power module efficiently and further avoids disassembling or moving other components in the apparatus casing during disassembly and assembly operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
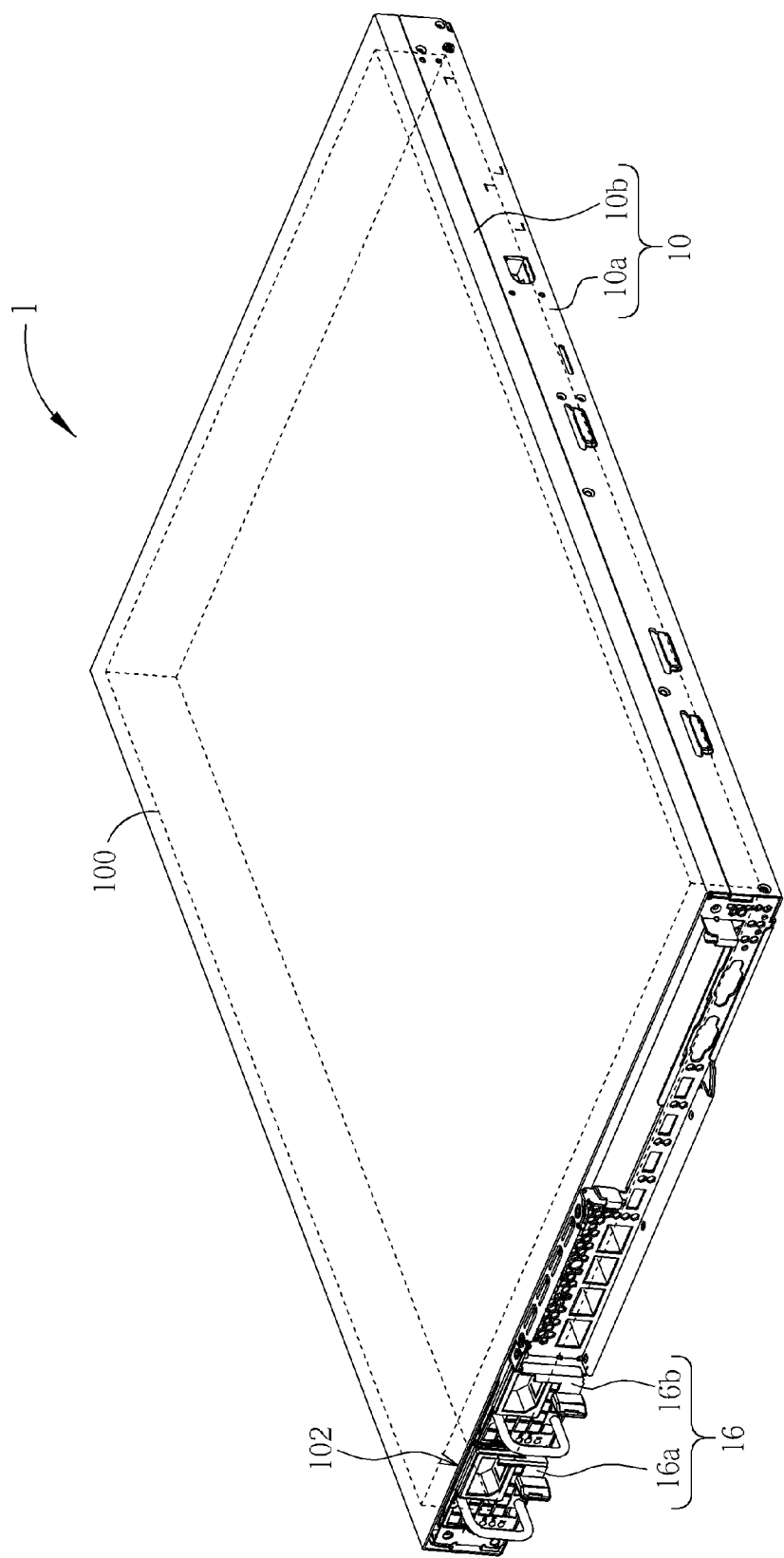
FIG. 1 is a schematic diagram illustrating an electronic apparatus of a first embodiment according to the invention.
Figure 2:
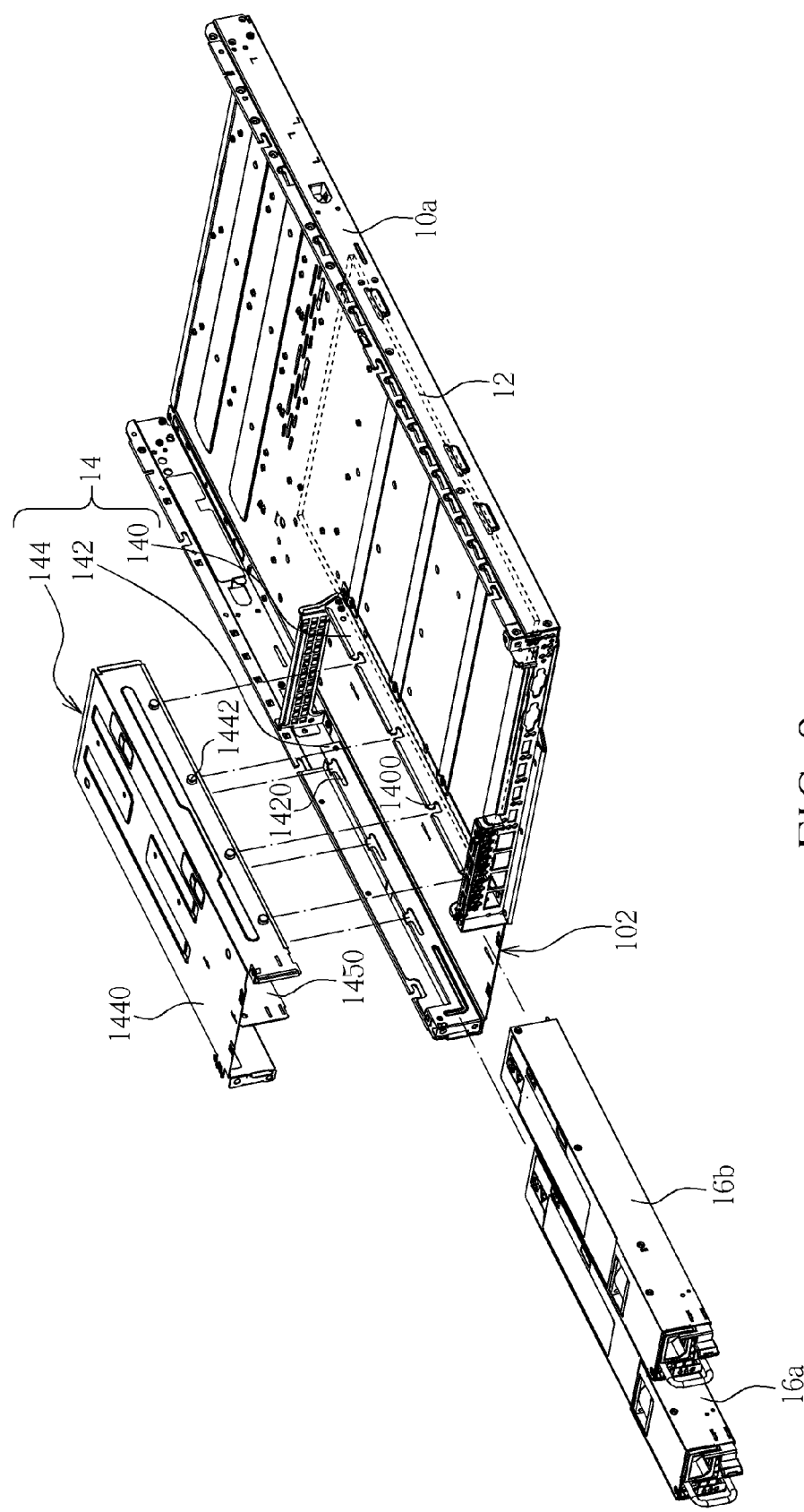
FIG. 2 is a partially-exploded view of the electronic apparatus in FIG. 1.

Please refer to FIG. 1 and FIG. 2. FIG. 1 is a schematic diagram illustrating an electronic apparatus 1 of a first embodiment according to the invention. FIG. 2 is a partially-exploded view of the electronic apparatus 1. In the first embodiment, the electronic apparatus 1 is a server, but the invention is not limited thereto. Therein, FIG. 1 shows the back side of the electronic apparatus 1. For simplification, the detailed structure of the connection ports is therefore omitted. The electronic apparatus 1 includes an apparatus casing 10, a main board 12, a fixing structure 14 for power module, a power module 16, and other components. The apparatus casing 10 has an accommodating space 100 inside (shown by dashed lines in FIG. 1) and has a first opening 102 connected to the accommodating space 100. The main board 12, the fixing structure 14, the power module 16, and the other components are disposed in the accommodating space 100.

Figure 3:
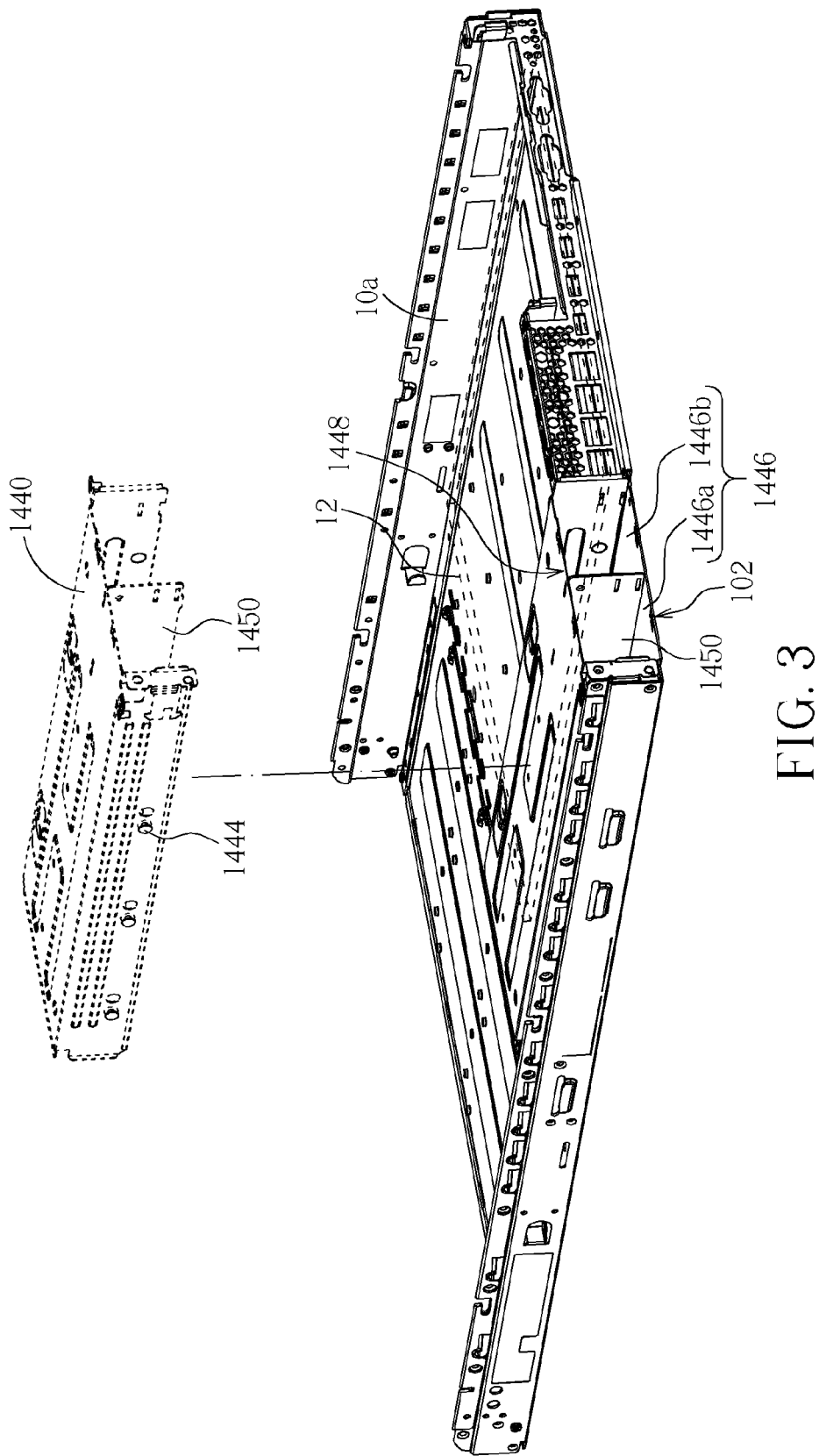
FIG. 3 is a schematic diagram illustrating the fixing structure and the apparatus casing of the electronic apparatus in FIG. 1 which have been assembled.
Figure 4:
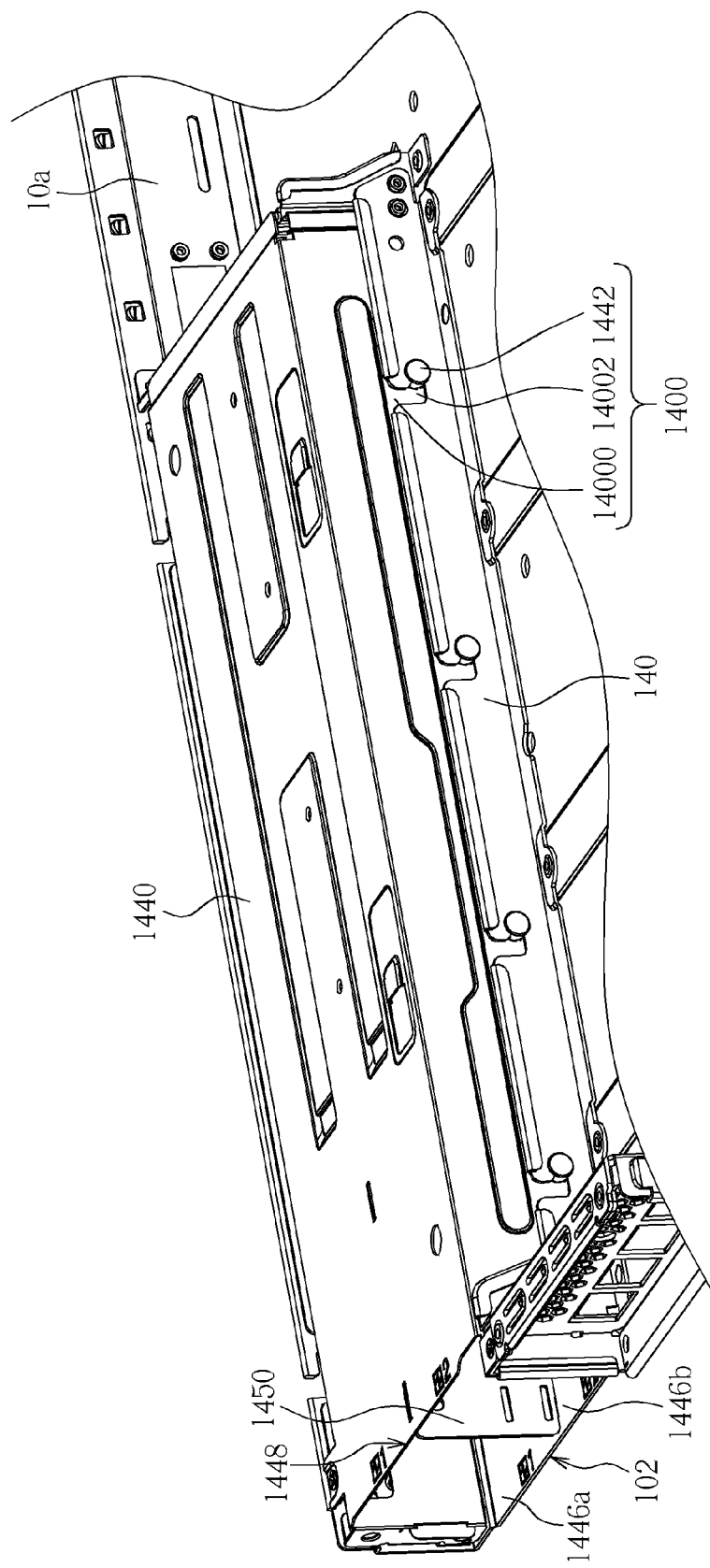
FIG. 4 is an enlarged view of the fixing structure and the apparatus casing in FIG. 3 in another view point.

Please also refer to FIG. 3 and FIG. 4. FIG. 3 is a schematic diagram illustrating the fixing structure 14 and the apparatus casing 10 having been assembled. FIG. 4 is an enlarged view of the fixing structure 14 and the apparatus casing 10 in FIG. 3 in another view point. In the first embodiment, the apparatus casing 10 consists mainly of a bottom plate 10a and an upper cover 10b connected with each other. For simplification, only the bottom plate 10a, the main board 12 (shown by dashed lines), the fixing structure 14, and the power module 16 are shown in the figures. The fixing structure 14 includes a first mounting base 140, a second mounting base 142, and a detachable bracket 144. The first mounting base 140 is mounted on the bottom plate 10a close to the main board 12. The second mounting base 142 is mounted on the bottom plate 10a opposite to the first mounting base 140. In the first embodiment, the first mounting base 140 and the second mounting base 142 respectively are an L-shaped plate member, but the invention is not limited thereto. The first mounting base 140 includes a sidewall vertical to the bottom plate 10a and forms a plurality of first sliding slots 1400 on the sidewall. The second mounting base 142 includes a sidewall vertical to the bottom plate 10a and forms a plurality of second sliding slots 1420 on the sidewall. The first sliding slot 1400 is an L-shaped sliding slot. The second sliding slot 1420 is a T-shaped sliding slot.

The detachable bracket 144 includes a frame 1440, and a plurality of first guiding parts 1442 and a plurality of second guiding parts 1444 which are oppositely connected to the frame 1440 fixedly. The first guiding parts 1442 and the second guiding parts 1444 correspond to the first sliding slots 1400 and the second sliding slots 1420 respectively. The first guiding part 1442 is capable of being slid into the first sliding slot 1400 and the second guiding part 1444 is capable of being slid into the second sliding slot 1420, so as to mount the detachable bracket 144 on the first mounting base 140 and the second mounting base 142, as shown in FIG. 3. After the detachable bracket 144 is disposed in the apparatus casing 10, the frame 1440 forms an accommodating space 1446 in the apparatus casing 10. In the first embodiment, the accommodating space 1446 is divided from the accommodating space 100 of the apparatus casing 10. The accommodating space 1446 has a second opening 1448 toward the first opening 102. The power module 16 is capable of being inserted into the accommodating space 1446 through the second opening 1448 in a removable way. In the first embodiment, the second opening 1448 and the first opening 102 overlap totally, but the invention is not limited thereto. For example, the first opening 102 can be larger than the second opening 1448, so that the second opening 1448 only overlaps a part of the first opening 102. The rest of the first opening 102 can be used for exposing connection ports such as USB port, network connection port and so on disposed in the accommodating space 100 for connecting with external connectors. For another example, the second opening 1448 can be disposed inside the accommodating space 100 such that the second opening 1448 still faces toward the first opening 102; i.e. the second opening 1448 and the first opening 102 overlap in projection in the opening direction of the second opening 1448, which also can make the power module 16 capable of being inserted into the accommodating space 1446 through the first opening 102 and the second opening 1448. Furthermore, in the first embodiment, the detachable bracket 144 still includes a separator 1450 which is disposed in the accommodating space 1446 and connected to the frame 1440 to divide the accommodating space 1446 into two accommodating subspaces 1446a and 1446b. The power module 16 is a redundant power module which includes two removable power modules 16a and 16b capable of being inserted into the accommodating subspaces 1446a and 1446b respectively.

It is added that, as shown in FIG. 2, the first sliding slot 1400 includes an entrance portion 14000 and a sliding passage 14002 connected to the entrance portion 14000. The first guiding part 1442 is a boss, for example but not limited to T-shaped boss. The first guiding part 1442 is capable of entering the sliding passage 14002 from the entrance portion 14000 and moving to a fixing position so as to mount the detachable bracket 144 of the first mounting base 140, as shown in FIG. 4. Therein, the fixing position is the position of the detachable bracket 144 mounted in the apparatus casing 10. In the first embodiment, the fixing position is an end portion of the sliding passage 14002, but the invention is not limited thereto. Similarly, the second guiding part 1444 is capable of being slid into the second sliding slot 1420 by similar mechanism. Therein, the second sliding slot 1420 is T-shaped, a combination of two L-shaped sliding slots in structural logic. One of the L-shaped sliding slots is provided for the second guiding part 1444, for example but not limited to T-shaped boss to be slid in. The other L-shaped sliding slot is provided for fixing a built-in power module, which will be illustrated in detail by embodiment. In addition, in the first embodiment, the first mounting base 140 and the second mounting base 142 are located at two opposite sides of the frame 1440, which is conducive to the fixing stability of the detachable bracket 144, but the invention is not limited thereto.

Figure 5:
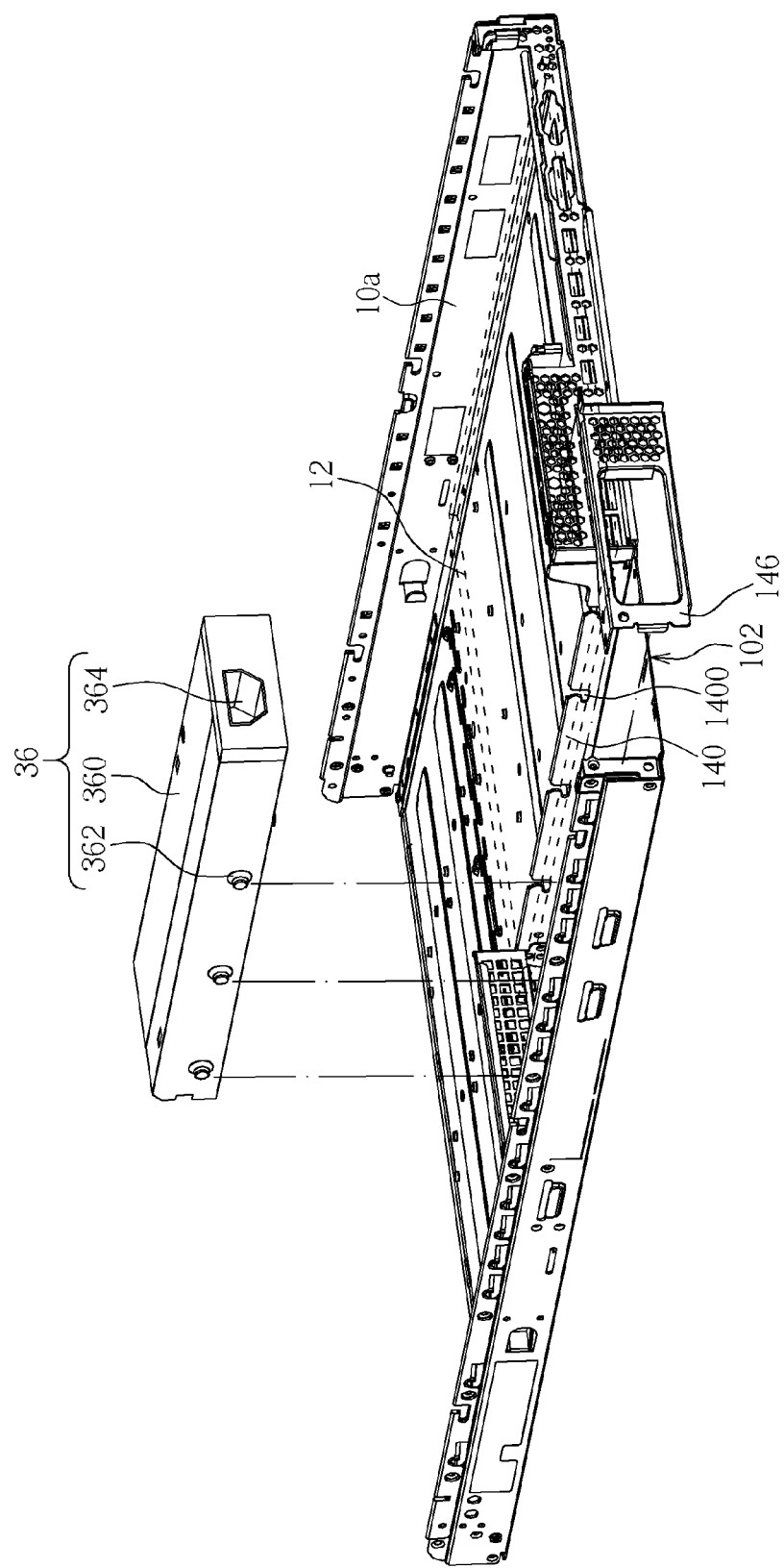
FIG. 5 is a partially-exploded view of an electronic apparatus of a second embodiment of the invention.

Please refer to FIG. 2 and FIG. 5. FIG. 5 is a partially-exploded view of an electronic apparatus of a second embodiment of the invention. The electronic apparatus of the second embodiment is structurally similar to the electronic apparatus 1 of the first embodiment. The difference is mainly that the electronic apparatus 1 is equipped with a redundant power module (i.e. the power module 16), while the electronic apparatus of the second embodiment is equipped with a built-in power module 36. Hence, the following description will be focused on the difference. For other descriptions of the electronic apparatus of the second embodiment, please refer to relational description of the first embodiment, which will not be repeated hereafter.

In the electronic apparatus of the second embodiment, the built-in power module 36 includes a casing 360 and a plurality of third guiding parts 362 connected to the casing 360 fixedly and corresponding to the second sliding slots 1420 of the second mounting base 142 (referring to FIG. 2). In the structural disposition of the apparatus casing 10, the built-in power module 36 occupies the same space as the power module 16 does, so in practice, the power module 16 and the detachable bracket 144 of the electronic apparatus 1 can be detached from the apparatus casing 10, and then the built-in power module 36 can be mounted on the second mounting base 142 by sliding the third guiding parts 362 into the second sliding slots 1420, so as to realize the main structure of the electronic apparatus of the second embodiment. Therein, the built-in power module 36 includes a connection port 364 such as but not limited to a socket for alternating current power, exposed out the second opening 1448. In addition, the volumes of the built-in power module 36 and the power module 16 are usually different, so in the second embodiment, the fixing structure 14 further includes a cover 146 engaged with the apparatus casing 10 to cover a part of the first opening 102 (or the second opening 1448) with exposure only of the built-in power module 36 for providing proper anti-dust effect to the apparatus casing 10. Therefore, it is unnecessary to disassemble or move the adjacent main board 12 for the detachable bracket 144 being assembled onto or disassembled from the first mounting base 140 and the second mounting base 142, which improves efficiency of changing power module and also solves the problem in the prior art that if the internal space of the apparatus casing is crowded so that the components inside are compactly disposed, the exchange of power module involves disassembling or moving the other components inside the apparatus casing.

Figure 6:
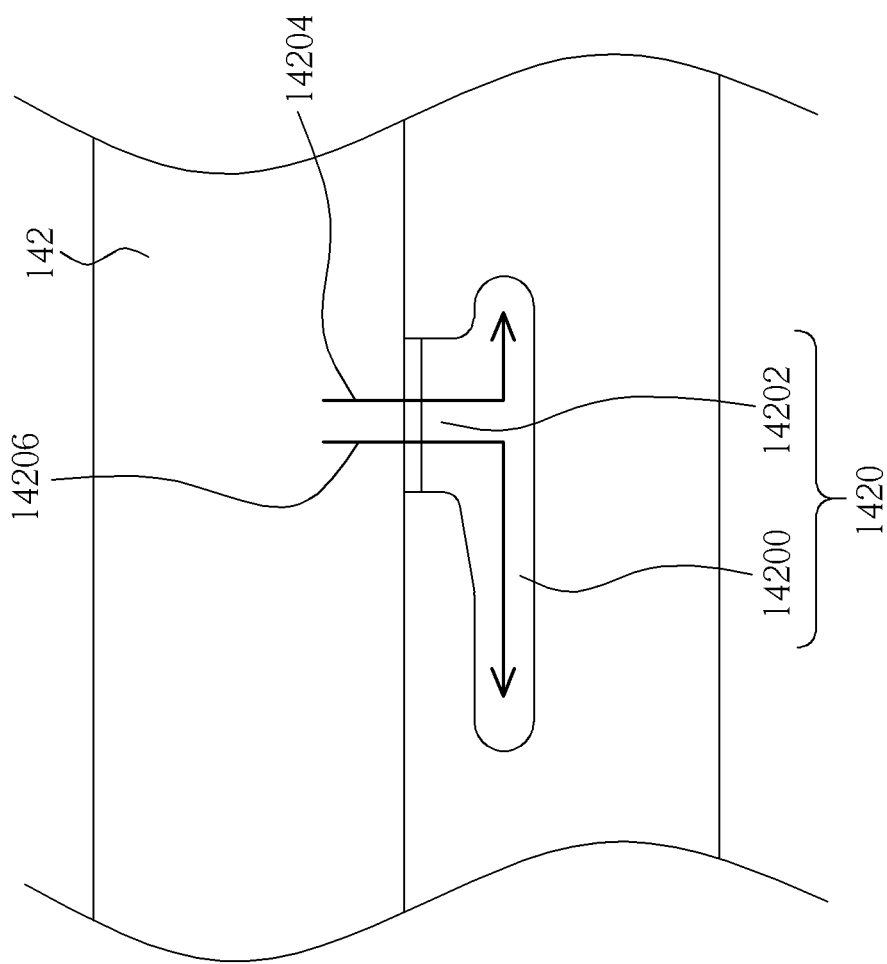
FIG. 6 is a schematic diagram illustrating the second sliding slot of the second mounting base in FIG. 2.

Please refer to FIG. 2 and FIG. 6. FIG. 6 is a schematic diagram illustrating the second sliding slot 1420 of the second mounting base 142. The second sliding slot 1420 can be used for fixing the built-in power module 36 and the power module 16, so the second sliding slot 1420 is designed to include a sliding passage 14200 and an entrance portion 14202 connected to a middle portion of the sliding passage 14200, so as to be a T-shaped sliding slot. In the structure of the electronic apparatus 1, the second guiding part 1444 (referring to FIG. 3) enters the sliding passage 14200 from the entrance portion 14202 and moves in a first direction 14204 to a fixing position, so as to mount the detachable bracket 144 on the second mounting base 142. Therein, the fixing position is the position of the detachable bracket 144 mounted in the apparatus casing 10. In the first embodiment, the fixing position is an end portion of the sliding passage 14002 along the first direction 14204, but the invention is not limited thereto. In another aspect, in the structure of the electronic apparatus of the second embodiment, the third guiding part 362 (referring to FIG. 5) enters the sliding passage 14200 from the entrance portion 14202 and moves in a second direction 14206 to a fixing position, so as to mount the built-in power module 36 on the second mounting base 142. Therein, the second direction 14206 is reverse to the first direction 14204. The fixing position is the position of the built-in power module 36 mounted in the apparatus casing 10. In the second embodiment, the fixing position is an end portion of the sliding passage 14002 along the second direction 14206, but the invention is not limited thereto. In the above embodiments, the second sliding slot 1420 is based on a integration design of sliding slot, which is conducive to avoiding structural weakness of the second mounting base 142 due to too many sliding slots formed on the second mounting base 142 and is conducive to reducing mechanism complexity by use of the reverse movements of the second guiding part 1444 and the third guiding part 362. Further, if the second sliding slot 1420 has different widths along different sliding slot extension directions such as the first direction 14204 and the second direction 14206, the second sliding slot 1420 can also provide foolproof effect.

Figure 7:
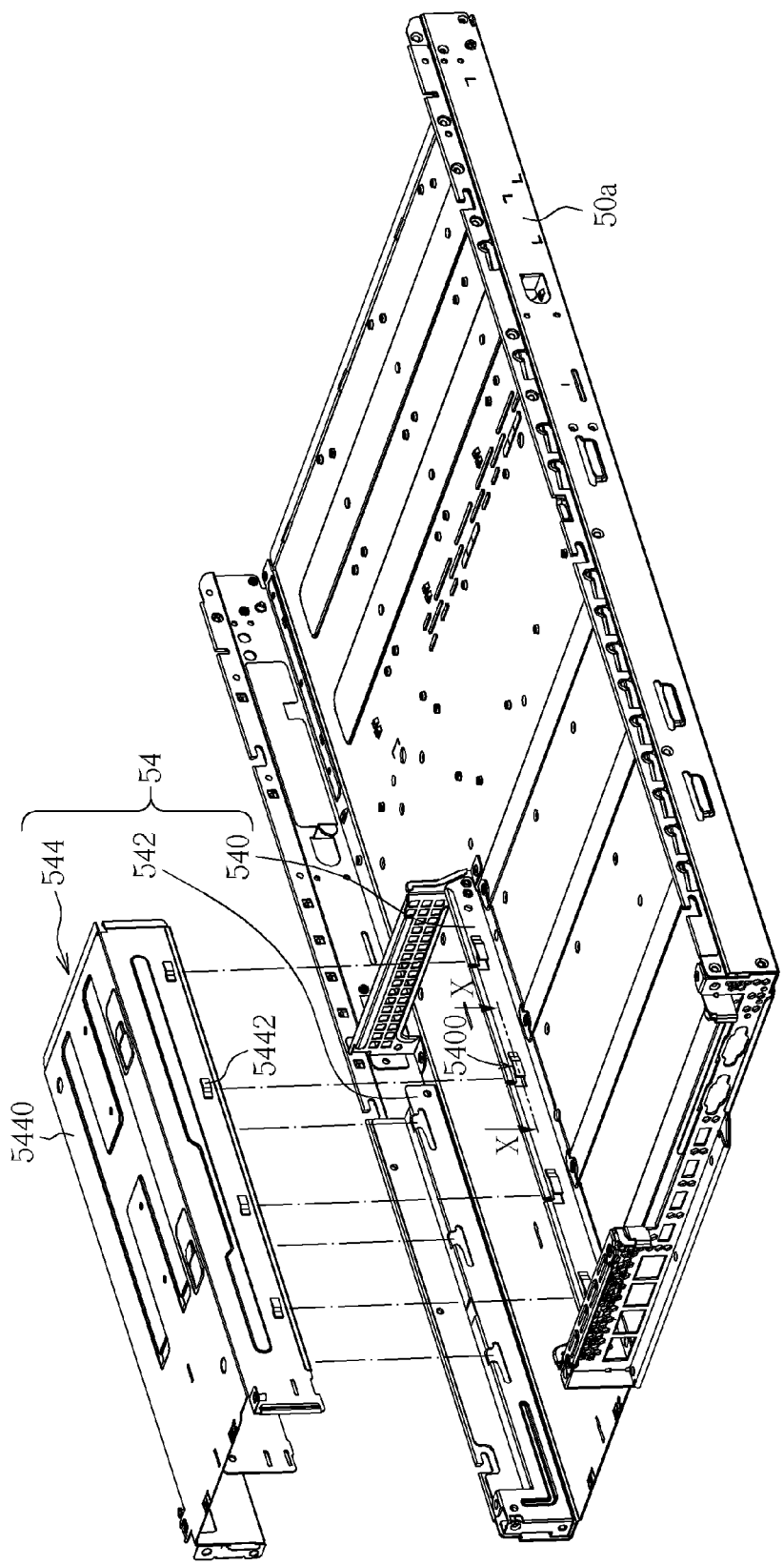
FIG. 7 is a schematic diagram illustrating a part of an electronic apparatus of a third embodiment according to the invention.
Figure 8:
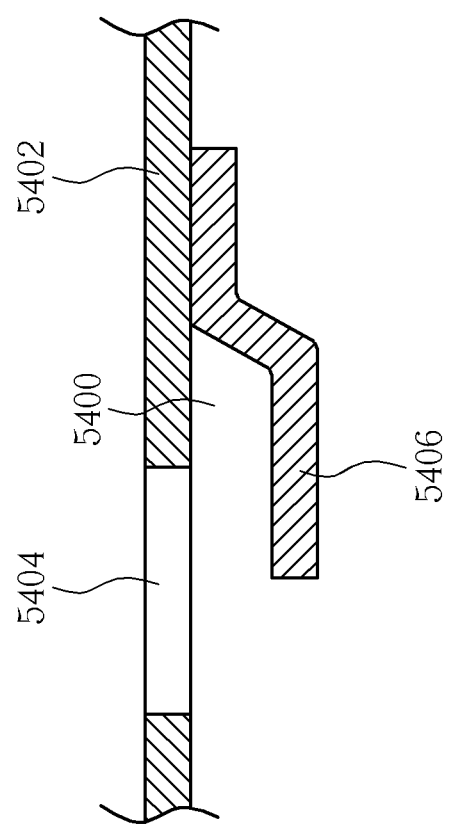
FIG. 8 is a sectional view of apart of the first mounting base of the fixing structure of the electronic apparatus in FIG. 7 along the line X-X.

In the above embodiments, the first sliding slots 1400 and the second sliding slots 1420 are realized by long and narrow through holes, but the invention is not limited thereto. Please refer to FIG. 7 and FIG. 8. FIG. 7 is a schematic diagram illustrating a part of an electronic apparatus of a third embodiment according to the invention. FIG. 8 is a sectional view of the first mounting base 540 of the fixing structure 54 in FIG. 7 along the line X-X. The electronic apparatus of the third embodiment is structurally similar to the electronic apparatus 1 of the first embodiment. The main difference is that the first sliding slot 5400 of the first mounting base 540 of the fixing structure 54 of the electronic apparatus of the third embodiment is a thin slot, and the first guiding part 5442 of the detachable bracket 544 is a thin plate and can be formed by bending and soldering a thin plate onto the frame 5440 in practice. In the third embodiment, the first mounting base 540 forms a gap 5404 on a sidewall 5402 thereof. The first mounting base 540 includes a retaining plate 5406 mounted on the sidewall 5402 close to the gap 5404. The retaining plate 5406 and the sidewall 5402 form the abovementioned thin slot therebetween. Thereby, the first guiding part 5442 is capable of being slid into the first sliding slot 5400 from the gap 5404 to be clamped in the first sliding slot 5400 by the first mounting base 540 so as to mount the detachable bracket 544 on the first mounting base 540. The second mounting base 542 of the fixing structure 54 can use the same structure as the second mounting base 142 of the fixing structure 14 of the above embodiment or use the same structure as the first mounting base 540, but the invention is not limited thereto. For other descriptions of the electronic apparatus of the third embodiment, please refer to relational descriptions of the first embodiment and the second embodiment, which will not be repeated hereafter.

Figure 9:
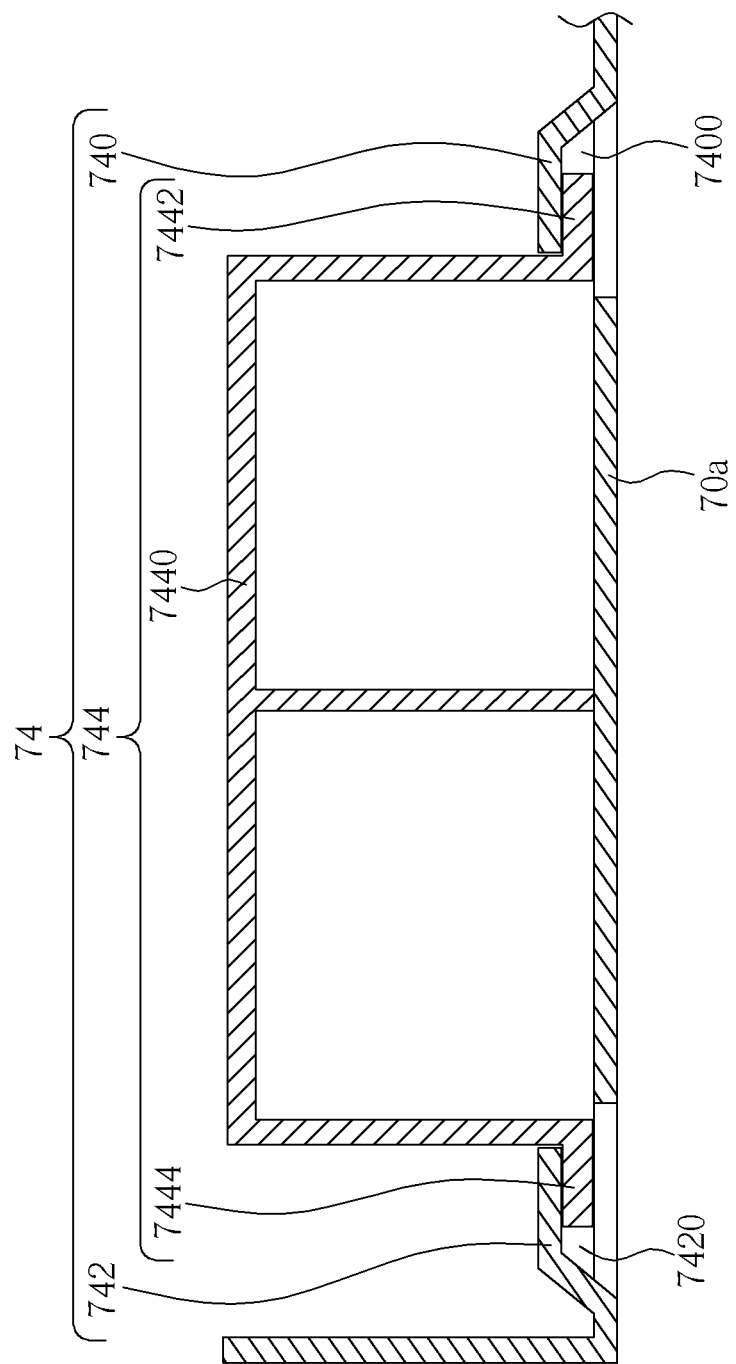
FIG. 9 is a sectional view of the fixing structure of an electronic apparatus of a fourth embodiment according to the invention.

In the third embodiment, the first sliding slot 5400 is still disposed on the sidewall vertical to the bottom plate 50a, but the invention is not limited thereto. Please refer to FIG. 9. FIG. 9 is a sectional view of the fixing structure 74 of an electronic apparatus of a fourth embodiment according to the invention. The electronic apparatus according to the fourth embodiment is structurally similar to the electronic apparatus 1. The main difference is that the fixing structure 74 in FIG. 9 also use the engagement of a thin slot with a thin plate for mounting the detachable bracket 744, but different to the fixing structure 54 of the electronic apparatus according to the third embodiment. In the fourth embodiment, the first mounting base 740 and the second mounting base 742 of the fixing structure 74 are formed by the bottom plate 70a protruding upward. The first sliding slot 7400 of the first mounting base 740 and the second sliding slot 7420 of the second mounting base 742 are thin slots extending parallel to the bottom plate 70a. The first guiding part 7442 and the second guiding part 7444 of the detachable bracket 744 are thin plates bent from two sides of the frame 7440 and extending. Similarly, the thin plate can be clamped in the thin slot by sliding the first guiding part 7442 and the second guiding part 7444 into the first sliding slot 7400 and the second sliding slot 7420 respectively so as to mount the detachable bracket 744 on the first mounting base 740 and the second mounting base 742. For other descriptions of the electronic apparatus of the fourth embodiment, please refer to relational descriptions of the first embodiment, the second embodiment, and the third embodiment, which are not repeated herein.

As discussed above, the fixing structure of the invention simplifies disassembly and assembly operation by use of slide structure so that a user can disassemble, exchange and fix different power modules quickly without disassembling or moving other components in the apparatus casing. Especially for the fact that the internal space of the apparatus casing is crowded so that the components inside are compactly disposed, the benefit of the invention is more significant. Therefore, the invention can reduce the installation complexity of the conventional removable power module and also simplify the exchange operation of power module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing structure for a power module, the fixing structure is disposed in an apparatus casing, the apparatus casing having a first opening, the fixing structure comprising:
   a first mounting base mounted in the apparatus casing and thereon forming a first sliding slot;
   a second mounting base mounted in the apparatus casing opposite to the first mounting base, the second mounting base thereon forming a second sliding slot, the second sliding slot being a T-shaped sliding slot comprising a sliding passage and an entrance portion connected to a middle portion of the sliding passage; and
   a detachable bracket disposed in the apparatus casing and comprising a frame, a first guiding part connected to the frame fixedly, and a second guiding part connected to the frame fixedly opposite to the first guiding part, the first guiding part being capable of being slid into the first sliding slot and the second guiding part being capable of entering into the sliding passage from the entrance portion and moving in a fist direction to a fixing position so as to mount the detachable bracket on the first mounting base and the second mounting base, wherein the first mounting base and the second mounting base are located at two opposite sides of the frame, the frame forms an accommodating space in the apparatus casing, the accommodating space has a second opening toward the first opening, and a first power module outside the apparatus casing is capable of being inserted into the accommodating space through the second opening in a removable way, a second power module comprises a third guiding part and a connection port, when the detachable bracket is detached from the apparatus casing, the third guiding part is capable of entering into the sliding passage from the entrance portion and moving in a second direction to a fixing position so as to mount the second power module on the second mounding base, and the connection part is disposed toward the first opening, the second direction is reverse to the first direction, and the sliding passage has two different widths along the first direction and the second direction respectively.

2. The fixing structure of claim 1, wherein the first sliding slot comprises an entrance portion and a sliding passage connected to the entrance portion of the first sliding slot, the first guiding part is a boss, and the first guiding part is capable of entering the sliding passage of the first sliding slot from the entrance portion of the first sliding slot and sliding to a fixing position so as to mount the detachable bracket on the first mounting base.

3. The fixing structure of claim 2, wherein the first guiding part is a T-shaped boss.

4. The fixing structure of claim 3, wherein the first sliding slot is an L-shaped sliding slot.

5. The fixing structure of claim 2, wherein the first sliding slot is an L-shaped sliding slot.

6. The fixing structure of claim 1, wherein the first sliding slot is a thin slot, the first guiding part is a thin plate, and the thin plate is capable of being clamped in the thin slot by the first mounting base so as to mount the detachable bracket on the first mounting base.

7. The fixing structure of claim 6, wherein the first mounting base has a sidewall and a gap formed on the sidewall, the first mounting base comprises a retaining plate mounted on the sidewall close to the gap, the retaining plate and the sidewall forms the thin slot therebetween, and the thin plate is capable of being slid into the thin slot through the gap so as to mount the detachable bracket on the first mounting base.

8. An electronic apparatus with fixing structure for a power module, the electronic apparatus comprising:
   an apparatus casing having a first opening;
   a main board disposed in the apparatus casing;
   a fixing structure for a power module, disposed in the apparatus casing and comprising:
      a first mounting base mounted in the apparatus casing close to the main board and thereon forming a first sliding slot;
      a second mounting base mounted in the apparatus casing opposite to the first mounting base, the second mounting base thereon forming a second sliding slot, the second sliding slot is a T-shaped sliding slot comprising a sliding passage and an entrance portion connected to a middle portion of the sliding passage; and
      a detachable bracket disposed in the apparatus casing and comprising a frame, a first guiding part connected to the frame fixedly and a second guiding part connected to the frame fixedly opposite to the first guiding part, the first guiding part being capable of being slid into the first sliding slot and the second guiding part being capable of entering into the sliding passage from the entrance portion and moving in a first direction to a fixing position so as to mount the detachable bracket on the first mounting base and the second mounting base, wherein the first mounding base and the second mounding base are located at two opposite sides of the frame, the frame forms an accommodating space in the apparatus casing, and the accommodating space has a second opening toward the first opening;
   a first power module, capable of being inserted from outside the apparatus casing through the second opening into the accommodating space in a removable way; and
   a second power module comprising a third guiding part and a connection port, wherein when the detachable bracket is detached from the apparatus casing, the third guiding part is capable of entering into the sliding passage from the entrance portion and moving in a second direction to a fixing position so as to mount the second power module on the second mounting base, and the connection port is disposed toward the first opening, the second direction is reverse to the first direction, and the sliding passage has two different widths along the first direction and the second direction respectively.

9. The electronic apparatus of claim 8, wherein the first sliding slot comprises an entrance portion and a sliding passage connected to the entrance portion of the first sliding slot, the first guiding part is a boss, and the first guiding part is capable of entering the sliding passage of the first sliding slot from the entrance portion of the first sliding slot and sliding to a fixing position so as to mount the detachable bracket on the first mounting base.

10. The electronic apparatus of claim 9, wherein the first guiding part is a T-shaped boss.

11. The electronic apparatus of claim 9, wherein the first sliding slot is an L-shaped sliding slot.

12. The electronic apparatus of claim 8, wherein the first sliding slot is a thin slot, the first guiding part is a thin plate, and the thin plate is capable of being clamped in the thin slot by the first mounting base so as to mount the detachable bracket on the first mounting base.

* * * * *